United States Patent [19]

Matsuo et al.

[11] Patent Number: 5,335,204

[45] Date of Patent: Aug. 2, 1994

[54] SEMICONDUCTOR INTEGRATED CIRCUIT DEVICE

[75] Inventors: Akinori Matsuo, Higashiyamato; Masashi Watanabe, Kokubunji; Michio Fujimoto, Akishima; Masashi Wada, Fuchuu; Yoshiharu Nagayama, Fuchuu; Kazuo Naito, Fuchuu, all of Japan

[73] Assignees: Hitachi., Ltd.; Hitachi VLSI Engineering Corp., Tokyo, Japan

[21] Appl. No.: 69,988

[22] Filed: May 28, 1993

Related U.S. Application Data

[63] Continuation of Ser. No. 842,887, Feb. 26, 1992, Pat. No. 5,257,234, which is a continuation of Ser. No. 621,643, Dec. 4, 1990, Pat. No. 5,105,389, which is a continuation of Ser. No. 219,736, Jul. 15, 1988, Pat. No. 4,989,185.

[30] Foreign Application Priority Data

Jul. 15, 1987 [JP] Japan ................. 62-174703
Aug. 24, 1987 [JP] Japan ................. 62-208145

[51] Int. Cl.⁵ .............................. G11C 13/00
[52] U.S. Cl. .................. 365/230.01; 365/189.03; 365/230.06; 365/230.08
[58] Field of Search .......... 365/230.01, 189.03, 365/230.06, 230.08, 238.5

[56] References Cited

U.S. PATENT DOCUMENTS

| | | |
|---|---|---|
| 3,691,538 | 9/1972 | Haney et al. |
| 4,214,302 | 7/1980 | Schmidt . |
| 4,520,464 | 5/1985 | Hallauer . |
| 4,617,653 | 10/1986 | Matsuzaki et al. |
| 4,660,181 | 4/1987 | Saito et al. |
| 4,706,219 | 11/1987 | Mayata et al. |
| 4,718,038 | 1/1988 | Yoshida . |
| 4,763,302 | 8/1988 | Yamada . |
| 4,819,211 | 4/1989 | Takagi . |
| 4,833,656 | 5/1989 | Tobita . |
| 4,958,322 | 9/1990 | Kosugi et al. |
| 5,105,389 | 4/1992 | Matsuo et al. ........ 365/230.01 |

FOREIGN PATENT DOCUMENTS

0064801A2 11/1918 European Pat. Off. .
0210064A3 1/1987 European Pat. Off. .

OTHER PUBLICATIONS

"Hitachi Microcomputer Data Book, 8-bit Single Chip"; Hitachi, Ltd., 1984, pp. 823–861. (Provided in Japanese with an English Translation.)

Primary Examiner—Terrell W. Fears
Attorney, Agent, or Firm—Fay, Sharpe, Beall, Fagan, Munnich & McKee

[57] ABSTRACT

Means for changing-over address signals is provided in an address input portion, and the order of the signals to be input to an address decoder is changed according to external control signals. Alternatively, a reading output circuit is provided which reads data in bit unit different from that of the writing input circuit. Thus, data can be read and written even when the number of bits of data differs between in case of accessing a built-in memory of an LSI inside the LSI and in case of accessing it from outside the LSI.

20 Claims, 7 Drawing Sheets

SEMICONDUCTOR INTEGRATED CIRCUIT DEVICE

This application is a continuation application of U.S. Ser. No. 07/842,887, filed Feb. 26, 1992, now U.S. Pat. No. 5,257,234 which was a continuation application of U.S. Ser. No. 07/621,643, filed Dec. 4, 1990, now U.S. Pat. No. 5,105,389 which issued Apr. 14, 1992, which was a continuation application of U.S. Ser. No. 07/219,736, filed Jul. 15, 1988, now U.S. Pat. No. 4,989,185 which issued Jan. 29, 1991.

BACKGROUND OF THE INVENTION

The present invention relates to a semiconductor integrated circuit device, and more particularly to techniques which are especially effective when applied to an address change-over system in a semiconductor memory device (hereinbelow, termed "memory"). By way of example, the techniques are effectively utilized for an LSI (large-scale integrated circuit) which has a built-in rewritable ROM (Read Only Memory).

In a conventional LSI such as single-chip microcomputer having a built-in EPROM (Erasable Programmable ROM) in which FAMOS (floating-gate avalanche injection MOS) FETs are used as storage elements, addresses have been common to the operation of reading data from within the EPROM and the operation of writing data into the EPROM by means of an EPROM writer, and both the reading and writing of the data have been performed in, for example, 8-bit unit. Refer to, for example, "Hitachi Microcomputer Data Book, 8-bit Single Chip" p. 823–p. 861, issued by Hitachi, Ltd. in August 1984.

With enhancements in the functions of the single-chip microcomputer, the internal data bus of the LSI is sometimes configured of 16 bits so that data can be read out of the EPROM in word (16-bit) unit.

In this case, without any contrivance, data cannot be written into the built-in EPROM by the use of the conventional EPROM writer for 8 bits. It is accordingly necessary to develop an EPROM writer for 16 bits anew or to cope with the situation through software so that the data can be written using the EPROM writer for 8 bits.

However, the method in which the EPROM writer for 16 bits is developed anew is costly. On the other hand, the method in which the situation is coped with in software fashion has the drawback that a period of time required for the writing becomes longer.

Moreover, in a case where the capacity of the internal data bus of the LSI having the built-in EPROM is to be more enlarged into 32 bits, it is necessitated to develop an EPROM writer again or to alter the software.

SUMMARY OF THE INVENTION

An object of the present invention is to provide a memory which is suited to be built in an LSI.

Another object of the present invention is to make it possible that data items are read and written easily and smoothly without altering an external device (for example, the construction of a writer) or preparing software for an external device even when the number of bits of data to be read out of a memory built in an LSI differs between in case of accessing the memory inside the LSI and in case of accessing it from outside the LSI.

The above and other objects and novel features of the present invention will become apparent from the description of this specification and the accompanying drawings.

Typical aspects of performance of the present invention are summarized as follows:

An address input portion is provided with means for changing-over address signals so that the order of the signals to be input to an address decoder can be changed in conformity with an external control signal.

According to the expedient described above, addresses are changed-over in, for example, the way that when an EPROM inside an LSI is to be accessed from outside the LSI, the address signals having been input are supplied to the EPROM as they are, whereas when the EPROM is to be accessed within the LSI, the address signals are supplied to the EPROM after each of the bits thereof is shifted one bit to the upper bit side. Thus, when the EPROM from which data is read in 16-bit unit in the access operation within the LSI is to be accessed by an EPROM writer from outside the LSI, data can be read and written in 8-bit unit, whereby the objects can be accomplished. Besides, another construction of the present invention consists in disposing a reading output circuit which reads data in the unit of the number of bits different from that of a writing input circuit.

That is, the present invention makes it possible to change-over the matrix arrayals of the EPROM at will, whereby even when the configuration of the internal data bus of the LSI is altered, data can be written using the existing EPROM writer as it is.

DESCRIPTION OF THE PREFERRED EMBODIMENTS

Figure 1:
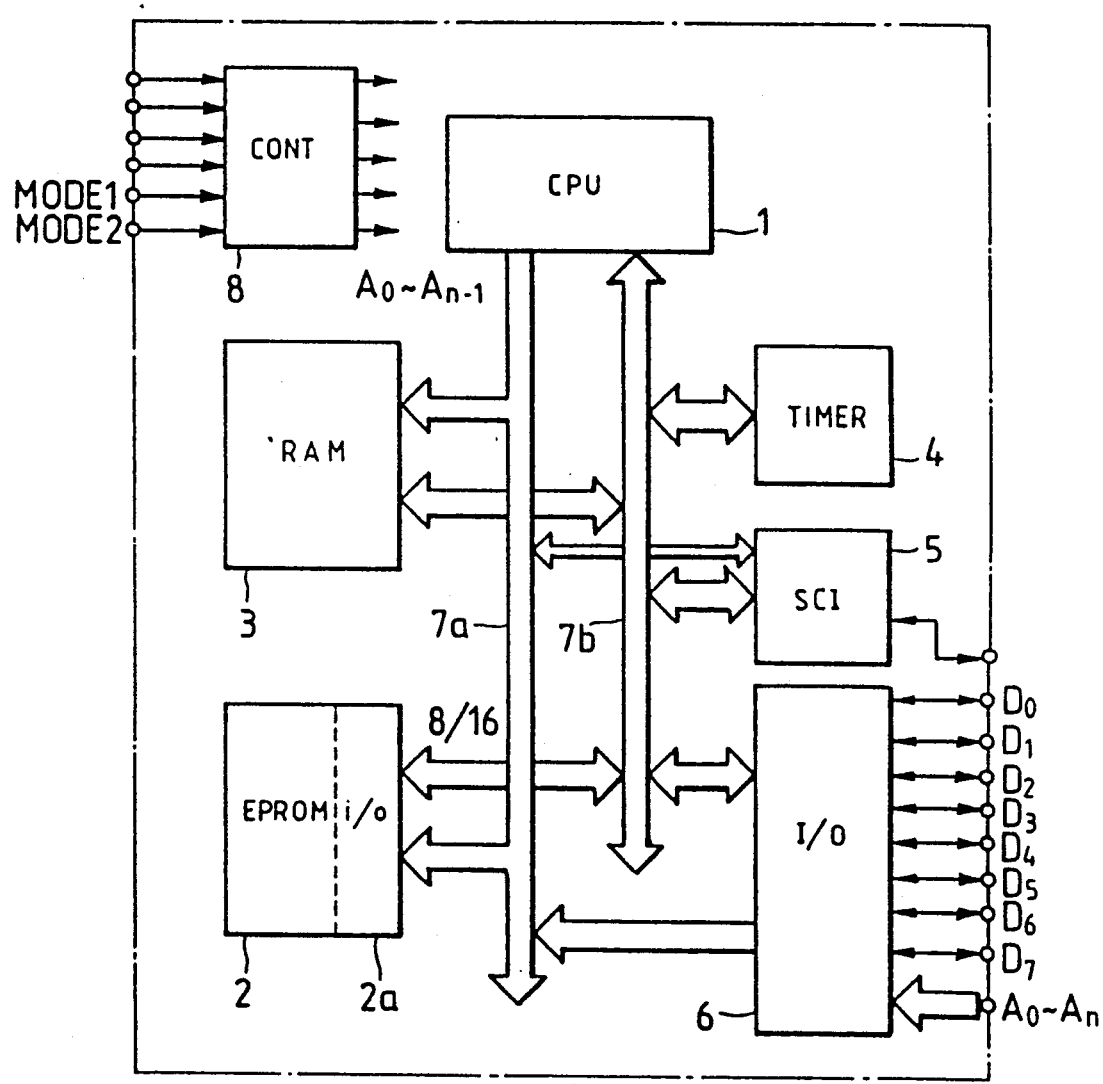
FIG. 1 is a block diagram showing an embodiment of a single-chip microcomputer which includes an EPROM.

Shown in FIG. 1 is an embodiment in the case where the present invention is applied to a single-chip microcomputer which uses an EPROM as an on-chip ROM. In the figure, various circuit blocks enclosed with a dot-and-dash line are formed on a single semiconductor substrate by well-known techniques for semiconductor integrated circuits. That is, the circuit blocks are formed on a single chip.

Although not especially restricted, the single-chip microcomputer of this embodiment comprises a microprocessor (hereinbelow, termed "CPU") 1 which controls the internal execution unit etc. thereof in accordance with programs, a ROM 2 in which the operation programs of the CPU 1, etc. are stored, a RAM (random access memory) 3 which principally offers the working space of the CPU 1, a timer circuit 4, a serial communication interface circuit (SCI) 5 which performs the serial communications between the microcomputer and external devices, and an input/output port 6. These constituent circuits are interconnected through an internal address bus 7a and an internal data bus 7b.

In addition, a control circuit 8 which determines the operation mode of the microcomputer and forms internal control signals corresponding thereto on the basis of a control signal supplied from outside is provided in the chip.

Although not especially restricted, the CPU 1 is constructed of a program counter in which the address of an instruction or data to be read out next is held, an instruction register into which the instructions of a program are fetched in order, a control portion which is made of a random logic circuit or a micro-ROM storing microprograms and which forms a control signal corresponding to the instruction fetched in the instruction register, and the execution unit which includes various registers such as accumulators, an ALU (arithmetic/logic unit), etc.

In this embodiment, the on-chip ROM 2 is constructed of a rewritable EPROM. This EPROM 2 is connected to the data bus 7b of 16 bits, and when accessed with address signals $A_0$–$A_{n-1}$ provided from the CPU 1, it delivers data of 16 bits onto the data bus 7b. On the other hand, the EPROM 2 can also be accessed through the input/output port 6 by any of an EPROM writer, etc. which are disposed outside the single-chip microcomputer. Indicated by symbols $D_0$–$D_7$ in FIG. I are eight data input/output terminals. In the single-chip microcomputer of this embodiment, when a write mode for the EPROM 2 is designated by mode switching control signals MODE1 and MODE2 applied to the control circuit 8, data is read out of the EPROM 2 and delivered onto the data bus 7b in 8-bit unit with address signals $A_0$–$A_n$ which are supplied from the external EPROM writer. In this case, the data output terminals of the EPROM connected to, for example, the upper 8 bits of the data bus 7b are connectible also to the lower 8 bits thereof. In the write mode of the EPROM, the upper 8 bits in the 16-bit data bus 7b are rendered floating, and data is written into the EPROM 2 or is read therefrom by the use of only the lower 8 bits. In order to permit the change-over between the numbers of bits of data as described above, an EPROM input/output portion 2a which is constructed of an address change-over circuit, sense amplifiers, a train of column switches, etc. to be described later is provided at the connection part of the EPROM 2 with the address bus 7a as well as the data bus 7b.

Figure 2A:
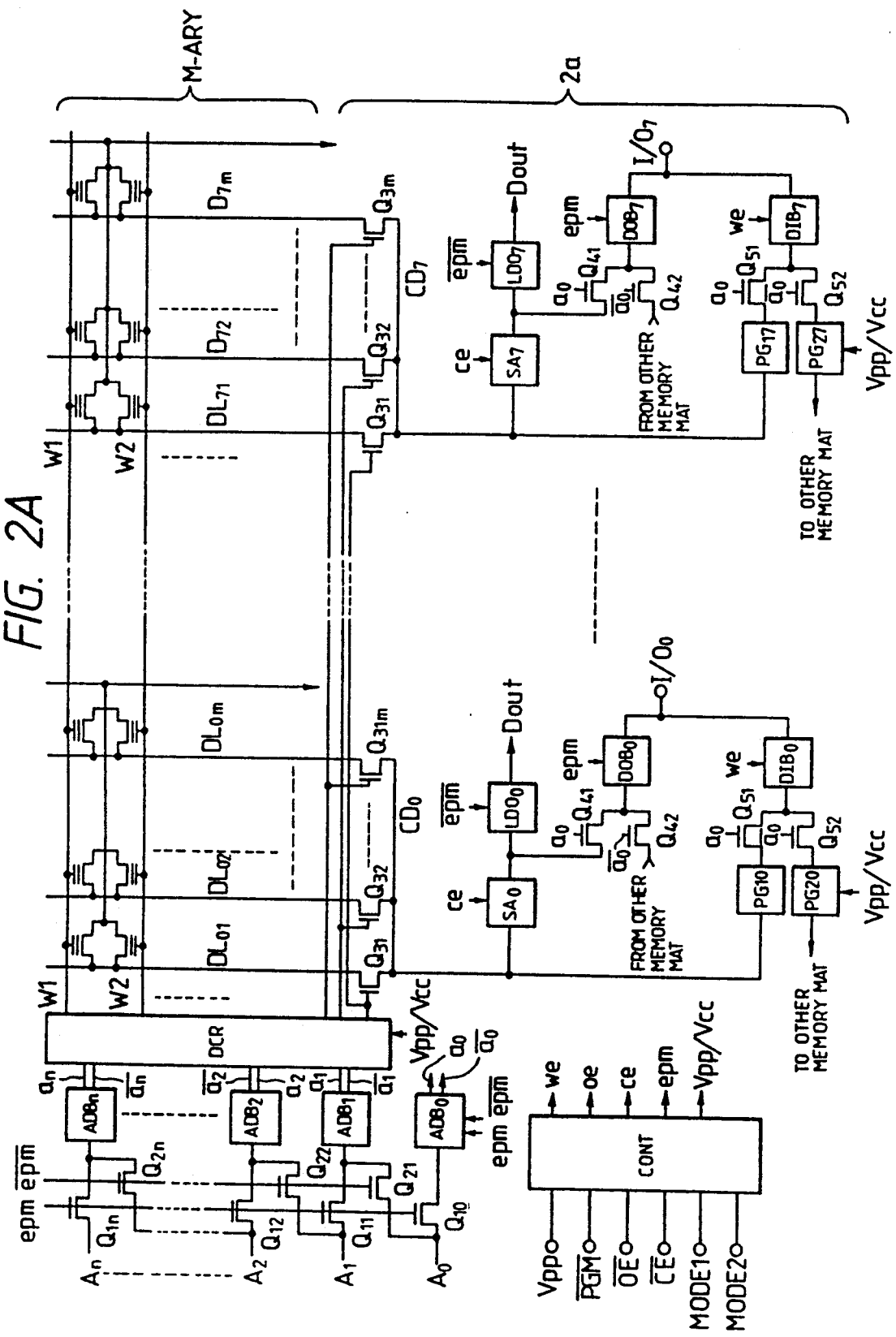
FIG. 2A is a block diagram showing an embodiment of the EPROM according to the present invention as is included in the single-chip microcomputer.

FIG. 2A, shows an embodiment of the practicable circuit of the EPROM 2 which is included in the single-chip microcomputer.

Although not especially restricted, the EPROM of this embodiment has an address decoder DCR supplied with complementary address signals $a_1$, $a_1$–$a_n$, $a_n$ which are formed through address buffers $ADB_1$–$ADB_n$ receiving the address signals $A_0$–$A_n$. Here, the address signal $A_0$ can be supplied to a first address buffer $ADB_0$ and the second address buffer $ADB_1$ through respective switch MOSFETs $Q_{10}$ and $Q_{21}$. In addition, the address signal $A_1$ can be supplied to the second address buffer $ADB_1$ and the third address buffer $ADB_2$ through respective switch MOSFETs $Q_{11}$ and $Q_{22}$. Thenceforth, connections are similarly made so that each of the address signals $A_2$–$A_{n-1}$ can be supplied to the two address buffers $ADB_i$ and $ADB_{i+1}$ through one pair of corresponding switch MOSFETs $Q_{1i}$ and $Q_{2(i+1)}$ (i=1, 2, ..., n−1). The address signal $A_n$ can be supplied to only the address buffer $ADB_n$, and it is not supplied to any of the address buffers when the switch MOSFET $Q_{2n}$ is turned "on" so as to supply the address signal $A_{n-1}$ to the address buffer $ADB_n$.

Each pair of switch MOSFETs $Q_{1i}$ and $Q_{2(i+1)}$ have either of them brought into the "on" state by change-over signals epm and $\overline{epm}$ from the control circuit (CONT) 8. The address decoder DCR forms select signals for the word lines $W_1$, $W_2$, ... of a memory array M-ARY and select signals for column switching MOSFETs $Q_{31}$–$Q_{3m}$ on the data lines $DL_{01}$–$DL_{0m}$, ... and $DL_{71}$–$DL_{7m}$ of the memory array M-ARY in accordance with the address signals which have been selectively supplied.

The data lines $DL_{01}$–$DL_{0m}$, ... and $DL_{71}$–$DL_{7m}$ are respectively connected to the corresponding ones of eight common data lines $CD_0$–$CD_7$ through the column selecting switch MOSFETs $Q_{31}$–$Q_{3m}$ which receive the select signals formed by the address decoder DCR. In addition, the output signals of writing data input circuits $DIB_0$–$DIB_7$ which receive write signals applied from corresponding read/write terminals $I/O_0$–$I/O_7$ are respectively supplied to write circuits $PG_{10}$–$PG_{17}$ through switch MOSFETs $Q_{51}$, and write signals boosted to a write voltage $V_{pp}$ are supplied to the common data lines $CD_0$–$CD_7$. The output signals of the input circuits $DIB_0$–$DIB_7$ can also be supplied to the common data lines of another memory mat through MOSFETs $Q_{52}$ as well as write circuits $PG_{20}$–$PG_{27}$. Sense amplifiers $SA_0$–$SA_7$ are respectively connected to the common data lines $CD_0$–$CD_7$, and read data items amplified by the sense amplifiers $SA_0$–$SA_7$ are delivered onto the internal data bus of the LSI through corresponding data buffers $LDO_0$–$LDO_7$ which are dedicated to the reading. Further, the outputs of the sense amplifiers $SA_0$–$SA_7$ are supplied to output buffers $DOB_0$–$DOB_7$ through switch MOSFETs $Q_{41}$ so as to be deliverable to the read/write terminals $I/O_0$–$I/O_7$, respectively. Moreover, the output buffers $DOB_0$–$DOB_7$ are respectively supplied with the corresponding ones of the eight sense amplifiers of the other memory mat through switch MOSFETs $Q_{42}$, alternatively to the output signals of the sense amplifiers $SA_0$–$SA_7$.

Figure 2B:
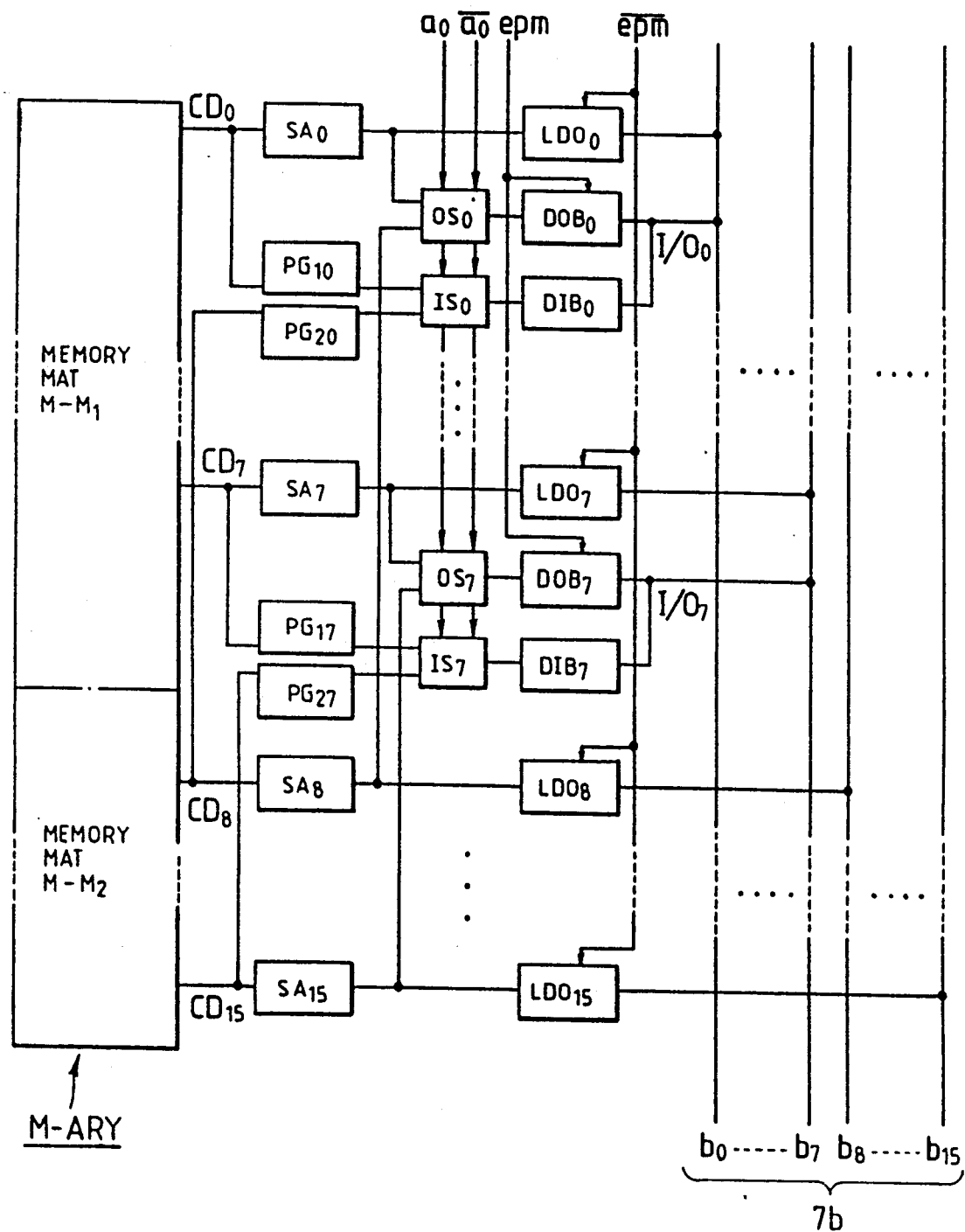
FIG. 2B is a block diagram for explaining the EPROM in FIG. 2A.

In this embodiment, as illustrated in FIG. 2B, the output terminals of the data buffers $LDO_0$–$LDO_7$ and the read/write terminals $I/O_0$–$I/O_7$ are respectively connected in common to the signal lines $b_0$–$b_7$ of the lower eight bits in the data bus 7b. It is also possible, however, that the data buffers $LDO_0$–$LDO_7$ are connected to the internal data bus, while the read/write terminals $I/O_0$–$I/O_7$ are connected to the external terminals of the IC. Besides, in this embodiment, the memory mats each having the construction of input/output in 8-bit unit as described above are disposed in the number of two, and the two memory mats M-$M_1$ and M-$M_2$ constitute one memory array M-ARY. Each memory mat M-$M_1$ (M-$M_2$) is furnished with the eight sense amplifiers $SA_0$–$SA_7$ ($SA_8$–$SA_{15}$), so that 8-bit data items can be read out in parallel as a whole. In FIG. 2A, only one M-$M_1$ of the two memory mats M-$M_1$ and M-$M_2$ is depicted. By the way, regarding the other memory mat M-M$_2$ not depicted in FIG. 2A, only the eight sense amplifiers SA$_8$–SA$_{15}$ and succeeding data buffers LDO$_8$–LDO$_{15}$ which are disposed in correspondence with this memory mat M-M$_2$ are connected as illustrated in FIG. 2A. The memory mat M-M$_2$ is connected to the signal lines b$_8$–b$_{15}$ of the upper 8 bits of the internal data bus 7b through these sense amplifiers SA$_8$–SA$_{15}$ and data buffers LDO$_8$–LDO$_{15}$, so that when the switch MOSFETs Q$_{42}$ are brought into their "on" states, the output signals of the sense amplifiers SA$_8$–SA$_{15}$ are respectively supplied to the output buffers DOB$_0$–DOB$_7$ shown in FIG. 2A. Thus, the read data items of the memory mat M-M$_2$ are delivered onto the signal lines b$_0$–b$_v$ of the lower 8 bits of the data bus 7b replacing the upper 8 bits b$_8$–b$_{15}$ thereof In this embodiment, each of the data buffers LDO$_0$–LDO$_{15}$ and the output buffers DOB$_0$–DOB$_7$ is constructed of a tristate buffer. Each of the data buffers LDO$_0$–LDO$_{15}$ has its operation controlled by the control signal $\overline{epm}$, while each of the output buffers DOB$_0$–DOB$_7$ has its operation controlled by the control signal epm. More specifically, when the control signal $\overline{epm}$ is at its high level, the data buffers LDO$_0$–LDO$_{15}$ deliver output signals conforming to the input signals thereof through the output nodes thereof. In contrast, when the control signal $\overline{epm}$ is at its low level, the data buffers LDO$_0$–LDO$_{15}$ bring the output nodes into the high impedance states thereof irrespective of the input signals. Meanwhile, when the control signal epm is at its high level, the output buffers DOB$_0$–DOB$_7$ deliver output signals conforming to the input signals thereof through the output nodes thereof. In contrast, when the control signal epm is at its low level, the output buffers DOB$_0$–DOB$_7$ bring the output nodes into the high impedance states thereof irrespective of the input signals. As will be described later, the control signal epm is set at the high level when the EPROM 2 is to be accessed by an external device (for example, EPROM writer). On this occasion, the control signal $\overline{epm}$ is set at the low level. On the other hand, when the EPROM 2 is to be accessed by any device inside the LSI, such as the CPU 1, the control signal $\overline{epm}$ is set at the high level. On this occasion, the control signal epm is set at the low level. In a case where the CPU 1 within the LSI has accessed the EPROM 2 in this way, the data items of the EPROM 2 are transmitted to the data bus 7b (signal lines b$_0$–b$_{15}$) through the data buffers LDO$_0$–LDO$_{15}$. Besides, in a case where the EPROM 2 has been accessed by the external device of the LSI, the data items of the EPROM 2 are transmitted to the data bus 7b (signal lines b$_0$–b$_7$) through the output buffers DOB$_0$–DOB$_7$.

In this embodiment, each of the buffers LDO$_0$–LDO$_{15}$ and DOB$_0$–DOB$_7$ is constructed of the tristate buffer as described before. Alternatively, it is allowed to employ an arrangement in which MOSFETs to be switched and controlled by the control signal $\overline{epm}$ are connected between the output nodes of the respective buffers LDO$_0$–LDO$_{15}$ and the data bus 7b, while MOSFETs to be switched and controlled by the control signal epm are connected between the output nodes of the respective buffers DOB$_0$–DOB$_7$ and the data bus 7b.

In FIG. 2B, for the brevity of the illustration, the change-over circuits constructed of the switch MOSFETs Q$_{41}$ and Q$_{42}$ are denoted by OS$_i$ (i=0–7), and the change-over circuits constructed of the switch MOSFETs Q$_{51}$ and Q$_{52}$ are denoted by IS$_i$ (i=0–7).

Further, although not especially restricted, the LSI of this embodiment is furnished with the input terminals of the mode switching control signals MODE1 and MODE2 in addition to those of a program control signal $\overline{PGM}$, an out enable signal $\overline{OE}$ and a chip enable signal $\overline{CE}$. The control circuit CONT (8) forms internal control signals we, oe, ce, epm, $\overline{epm}$ etc. for the circuit blocks inside the LSI, on the basis of the aforementioned control signals. V$_{pp}$ indicates the write voltage referred to before. Among the internal control signals which are output from the control circuit CONT, the signal we is formed on the basis of the external control signals $\overline{PGM}$ and $\overline{CE}$ by way of example, and it affords a timing for activating the data input circuits DIB$_i$ (i=0–7). In addition, the internal control signals ce and oe are formed on the basis of the external control signals $\overline{OE}$ and $\overline{CE}$, and they afford timings for activating the sense amplifiers SA$_i$ (i=0–15) and the data buffers LDO (i=0–15) as well as the output buffers DOB$_i$ (i=0–7), respectively, though no special restriction is meant. In FIGS. 2A and 2B, the supply of the control signal oe to these buffers is omitted for the brevity of the illustration. Further, the internal control signals epm and $\overline{epm}$ are principally formed on the basis of the mode switching control signals MODE1 and MODE2 supplied from outside, and they turn "on" either of the switch MOSFETs Q$_{10}$–Q$_{1n}$ and Q$_{21}$–Q$_{2n}$ as the address change-over means and afford a timing for activating the address buffers ADB$_0$–ADB$_n$.

The LSI of this embodiment having the built-in EPROM has the EPROM write mode designated by the mode switching control signals MODE1 and MODE2 when the EPROM writer is connected thereto. Thus, the internal control signal epm is set at the high level, and the internal control signal $\overline{epm}$ at the low level. Consequently, the switch MOSFETs Q$_{10}$–Q$_{1n}$ are brought into the "on" states, and the switch MOSFETs Q$_{21}$–Q$_{2n}$ into the "off" states. Thus, the address signals A$_0$–A$_n$ supplied from the external device (EPROM writer) not shown are respectively input to the address buffers ADB$_0$–ADB$_n$, to form the internal address signals a$_0$–a$_n$ and $\overline{a_0-a_n}$. On the basis of the signals a$_1$–a$_n$ and $\overline{a_1-a_n}$ among these internal address signals, one of the word lines in the memory array M-ary is selected, and the sixteen data lines are connected to the sense amplifiers SA$_i$ (i=0–15) as well as the write circuits PG$_i$ (i=10–17, 20–27). Concurrently, either the groups of switch MOSFETs Q$_{41}$ and Q$_{51}$ or Q$_{42}$ and Q$_{52}$ are brought into the "on" states by the internal address signals a$_0$ and $\overline{a_0}$ which are output from the address buffer ADB$_0$. As a result, data items are written into the memory array M-ARY through the terminals I/O$_0$–I/O$_7$ in 8-bit unit and in parallel by the use of the EPROM writer. Reading for verification is also executed.

On the other hand, when a normal operation mode (of at least two sorts) in which the internal circuit (for example, EPROM 2) is put under the control of the CPU 1 is designated by the mode switching control signals MODE1 and MODE2 supplied from outside, the internal signal epm is set at the low level, and the internal signal $\overline{epm}$ is set at the high level. Thus, the address changing-over MOSFETs Q$_{10}$–Q$_{1n}$ are brought into the "off" states, and those Q$_{21}$–Q$_{2n}$ into the "on" states. Consequently, the address signals A$_0$–A$_{n-1}$ supplied from the circuit inside the LSI, such as CPU 1, are respectively supplied to the address buffers ADB$_1$–ADB$_n$. That is, the address signals which are shifted one bit to the upper bit side with respect to the address signals in the EPROM writer mode are input to the address buffers of the EPROM 2. On this occasion, the address buffer $\underline{ADB_0}$ is controlled by the internal signals epm and $\overline{epm}$ to have both the internal address signals $a_0$ and $\overline{a_0}$ fixed to the low level. Thus, the sixteen data lines in the memory array M-ARY are respectively connected to the sixteen sense amplifiers $SA_i$ (i=0–15), and data items of 16 bits are output from the data buffers $LDO_i$ (i=0–15) onto the internal data bus 7b. On this occasion, the output buffers $DOB_i$, write circuits $PG_i$ and input buffers $DIB_i$ are brought into the non-operating states thereof by the internal control signals oe and we though no special restriction is intended.

In this manner, in the single-chip microcomputer of the embodiment, the number of bits of the input/output data of the EPROM, namely, the number of bits of the data items to be input/output in parallel can be changed-over between 8 bits and 16 bits in the modes of the EPROM designated by the mode switching control signals MODE1 and MODE2 externally supplied, namely, in the mode of writing data into the EPROM and the normal mode (read mode except the verify mode). Thus, even when the internal data bus 7b is configured of 16 bits (bits or signal lines $b_0$–$b_{15}$), data can be written into the EPROM 2 by the use of the EPROM writer for 8 bits.

Although the above embodiment has referred to the case of the internal data bus 7b configured of 16 bits, the present invention can also be applied to a case of an internal data bus configured of 32 bits by dividing the memory array into four memory mats by way of example.

Figure 3:
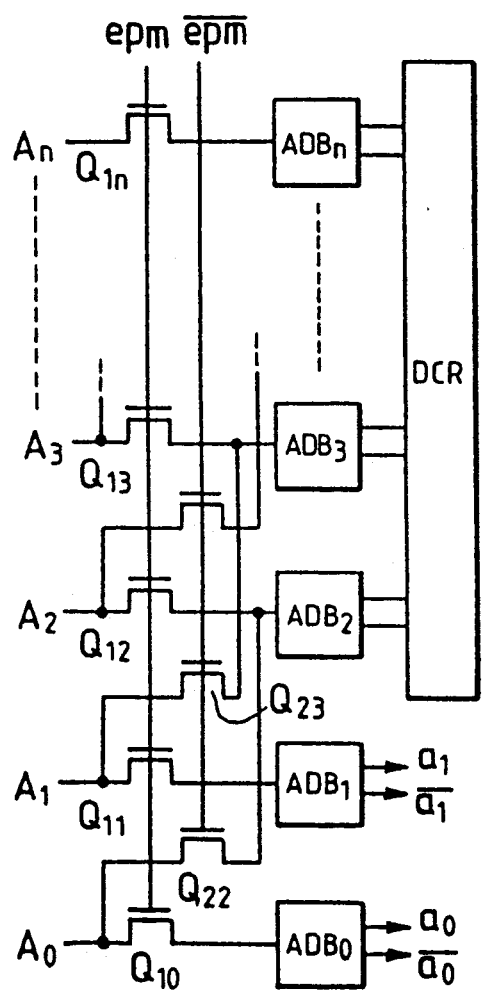
FIG. 3 is a circuit diagram showing another embodiment of an address input portion in the EPROM.

Shown in FIG. 3 is an example of arrangement of an address change-over portion in the case where the internal data bus 7b is of 32 bits. As seen from the figure, in this embodiment, the address signals $A_0$–$A_n$ are shifted two bits to the upper bit side and then input to the address buffers $ADB_2$–$ADB_n$ of the EPROM 2 in the normal mode by the switch MOSFETs $Q_{10}$–$Q_{1n}$ and $Q_{22}$–$Q_{2n}$ which are respectively controlled by the internal control signals epm and $\overline{epm}$. That is, the address signals $A_0$–$A_{n-2}$ are respectively input to the address buffers $ADB_2$–$ADB_n$. Meanwhile, although not shown in the figure, the memory array M-ARY is constructed of four memory mats M-$M_1$ thru M-$M_4$, from or into each of which data items of 8 bits can be-read or written in parallel.

When the EPROM writer has been connected, the address signals $A_0$ and $A_1$ are respectively supplied to the address buffers $ADB_0$ and $ADB_1$ and are used for the formation of select signals for selecting one of the four memory mats. That is, on this occasion, the address signals $A_0$ and $A_1$ are used as address signals for specifying one memory mat from among the memory mats M-$M_1$ thru M-$M_4$.

In this embodiment, therefore, it becomes possible to change-over the input/output of data in 8-bit unit and the output of data in 32-bit unit (to change-over data).

Incidentally, in both the foregoing embodiments, the MOSFETs $Q_{10}$–$Q_{1n}$ and $Q_{22}$–$Q_{2n}$ as the address change-over means are disposed at the stages preceding the respective address buffers $ADB_0$–$ADB_n$. Alternatively, the address change-over means may well be disposed at the stages succeeding these address buffers, in other words, between the address buffers and the address decoder DCR.

Besides, in order to facilitate the description, the embodiments have been explained as constructing the memory array out of the plurality of mats. However, the construction of the memory array is not restricted thereto, but similar functional effects can be attained even with a memory array constructed of a single mat by applying the concept of the present invention thereto.

Figure 4:
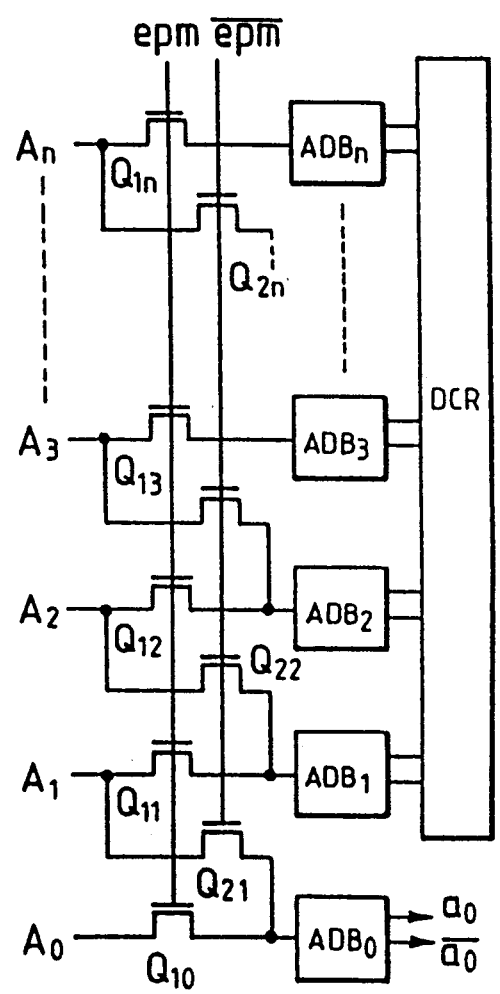
FIG. 4 is a circuit diagram showing still another embodiment of the address input portion of the EPROM.

Further, in the embodiments, the address signals are shifted to the upper bit side and then input to the address buffers ADB in the normal mode. However, the address input portion may well be constructed as shown in FIG. 4, whereby the address signals are shifted to the lower bit side and then input to the address buffers ADB in the mode of writing data into the EPROM 2.

As thus far described, in the embodiments, the address input portion is furnished with the change-over means for the address signals, so that the order of the signals to be input to the address decoder DCR can be changed according to the external control signals. Thus, when the EPROM in the LSI is to be accessed from outside the LSI, the address signals having been input are supplied to the address decoder as they are, and when the EPROM is to be accessed within the LSI, the address is changed-over so that the respective bits of the address signals may be shifted one bit or two bits to the upper bit side and then supplied to the address decoder. Therefore, when the EPROM from which data is read in 16-bit unit or 32-bit unit in the internal access is to be accessed by the EPROM writer from outside, data is read or written in 8-bit unit. This produces the effect that data can be read and written easily and smoothly without altering any external device disposed outside the LSI or preparing software for the change-over of an address.

By the way, in the embodiments, the groups of switch MOSFETs $Q_{41}$ and $Q_{42}$ for switching the mats are disposed between the sense amplifiers SA and the output buffers DOB, but they may well be interposed between the common data lines CD and the sense amplifiers SA.

In addition, in the embodiments, the data buffers $LDO_0$–$LDO_7$ and the output buffers $DOB_0$–$DOB_7$ are separately disposed, but they may well be constructed of common buffers. By way of example, it is allowed to employ an arrangement in which the data buffers $LDO_0$–$LDO_7$ are omitted and in which switching MOSFETs are additionally connected in parallel with the switching MOSFETs $Q_{41}$ and have their gates supplied with the control signal $\overline{epm}$ so as to be switched and controlled. In this case, to the end of permitting the output buffers $DOB_0$–$DOB_7$ to function also as the data buffers $LDO_0$–$LDO_7$, the output buffers $DOB_0$–$DOB_7$ are constructed of tristate buffers whose states are controlled by the signal oe, not by the signal epm.

Figure 5:
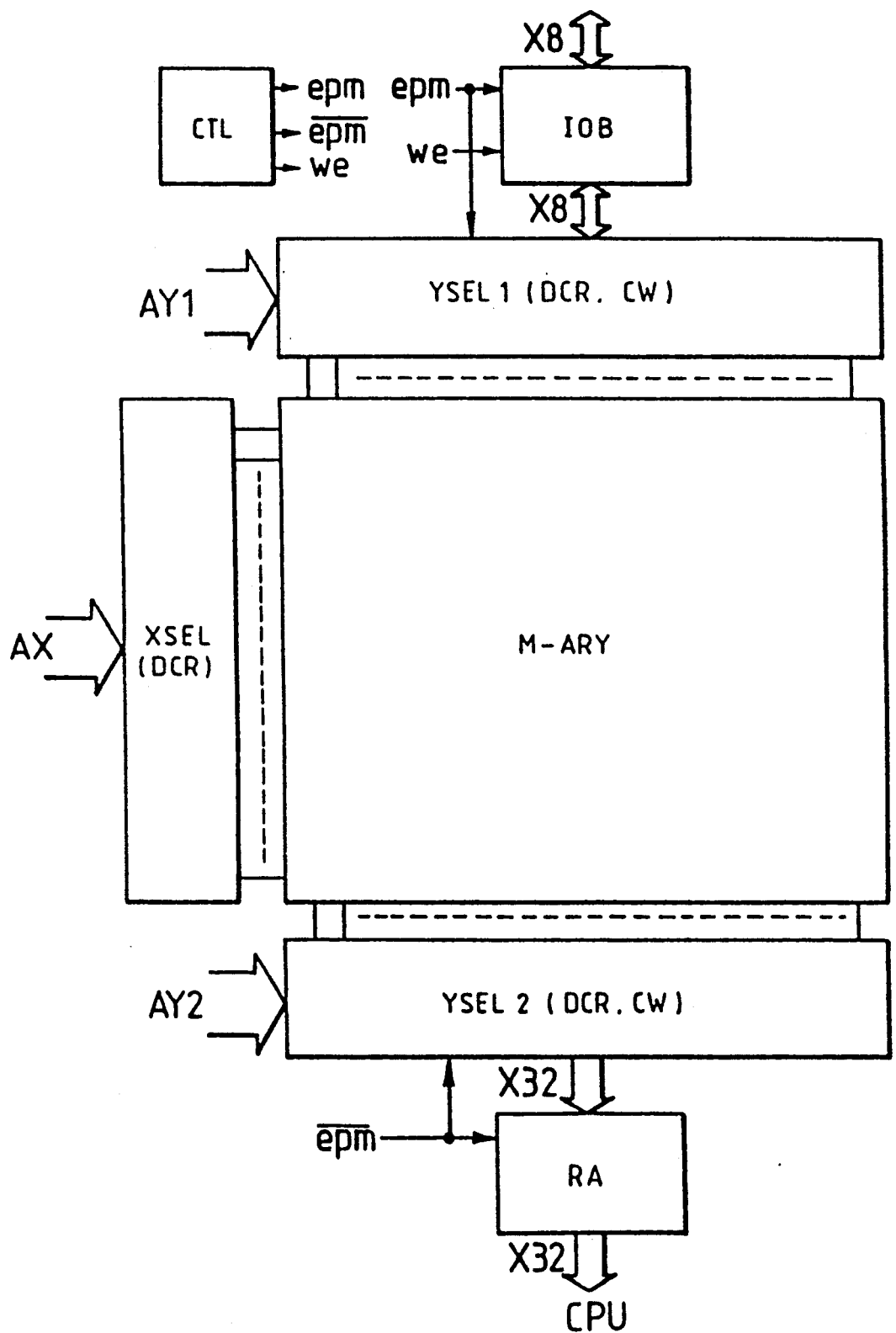
FIG. 5 is a block diagram showing another embodiment of an EPROM circuit according to the present invention.

Shown in FIG. 5 is a block diagram of another embodiment of the on-chip EPROM according to the present invention.

A memory array M-ARY is so constructed that nonvolatile storage elements each having a stacked gate structure provided with a floating gate and a control gate are arranged in the shape of a matrix. The control gates of the stacked-gate transistors constituting the memory cells are coupled to word lines which are extended in the lateral direction as viewed in the figure. Besides, the drains of the stacked-gate transistors are coupled to data lines (bit lines or digit lines) which are extended in the vertical direction as viewed in the figure. The memory array M-ARY is formed of the memory matrix which is similar in construction to that of a known EPROM as stated above.

The word line of the memory array M-ARY is brought into the selected state thereof by an X-selector circuit XSEL. The X-selector circuit XSEL is constructed of a decoder circuit which receives X-address signals AX and decodes them. In the write operation of the EPROM, the select level of the word line is rendered a high voltage level of, for example, about 12 V necessary for the write operation, whereas in the read operation, it is rendered a comparatively low level of, for example, about 5 V. Therefore, the X-selector circuit XSEL has the level conversion function of forming the different select levels in accordance with the write mode and the read mode of the EPROM.

This embodiment is furnished with two Y-selector circuits YSEL1 and YSEL2 for writing and reading data in order that, while the write operation with a universal EPROM writer is realized, reading in the unit of any desired number of bits irrespective of the write operation may be permitted. More specifically, the data lines of the memory array M-ARY are subjected to select operations by the Y-selector circuit YSEL1 in the write mode. The writing Y-selector circuit YSEL1 is constructed of a decoder circuit (DCR) which receives writing Y-address signals AY1 and decodes them, and a column switching circuit (CW) which selects a plurality of data lines from within the memory array M-ARY in conformity with the outputs of the decoder circuit. By way of example, the universal EPROM writer not shown writes data in 8-bit (R-byte) unit, and hence, an input/output circuit IOB suited thereto is provided. In this case, the Y-selector circuit YSEL1 performs the select operation of selecting eight of the data lines of the memory array M-ARY and connecting them to the input/output circuit IOB in accordance with the designated Y-address signals AY1.

The EPROM writer needs to perform the reading of the memory array M-ARY upon designating a verify mode or read mode for checking whether or not desired data has been written into the memory cells. To this end, the input/output circuit IOB is provided as stated above. For such write/read operations, column select signals which are formed by the decoder circuit (DCR) of the Y-selector circuit YSEL1 are brought for the write operation to a high voltage level of, for example, about 12 V so that write signals of high level can be transmitted to the data lines, and they are brought for the read operation to a comparatively low level of, for example, about 5 V. Therefore, the decoder circuit (DCR) has the level conversion function of forming the different select levels in accordance with the write mode and the read mode.

Owing to the input/output circuit IOB and the writing Y-selector circuit YSEL1, the operation of writing data into the memory array M-ARY in 8-bit unit can be performed using the universal EPROM writer. Besides, the read operation in 8-bit unit is possible for the verify mode. In this embodiment, the reading Y-selector circuit YSEL2 is provided in order that data and information processing procedures such as microprograms, which are stored in the memory array M-ARY, may be read in the unit of any desired number of bits as stated before.

The data lines of the memory array M-ARY are subjected to select operations by the Y-selector circuit YSEL2 when the read operation is performed by a circuit, such as CPU, formed on the same chip as that of the EPROM. The reading Y-selector circuit YSEL2 is constructed of a decoder circuit (DCR) which receives reading Y-address signals AY2 and decodes them, and a column selecting circuit (CW) which selects a plurality of data lines from within the memory array M-ARY in conformity with the output signals of the decoder circuit. By way of example, in a case where microprograms are stored in the memory array M-ARY and where each program word is configured of 32 bits (4 bytes), the Y-selector circuit YSEL2 suitably selects the data lines in 32-bit unit so as to perform the reading in 32-bit (4-byte) unit in conformity with the program word. That is, in accordance with the designated Y-address signals AY2, the Y-selector circuit YSEL2 selects thirty-two data lines from among the plurality of data lines of the memory array M-ARY, and it supplies the signals of the selected data lines to a read circuit RA so as to transmit them to, e.g., the microprogram decode circuit of the microprocessor CPU. The read circuit RA has sense amplifiers for amplifying (detecting) the data items on the selected data lines.

Incidentally, in this case, the operation of selecting the word line in the memory array M-ARY is the same as in the case of the read operation in the verify mode described above.

Since, in this embodiment, the two Y-selector circuits as data line selector circuits are arranged at both the ends of the data lines of the memory array M-ARY as illustrated in the figure, it is possible to perform the write operation employing the universal EPROM writer and the read operation in the unit of any desired number of bits irrespective of the bit unit of the write operation.

The number of bits of data items which are written in parallel at one time in the write operation, and the number of bits of data items which are read in parallel at one time for the circuit (such as CPU) formed on the same chip as that of the EPROM are unequal as described above. For this reason, the write data items in the write operation are, of course, written into the EPROM as data having a specified significance or in the divided form of the program word. That is, data or a program word of 16-bit length is decomposed into two parts each having 8 bits, and data or a program word of 32-bit length is divided into four parts, whereupon such parts are written in byte unit by, e.g., the EPROM writer from outside.

In the figure, symbol CTL denotes a control circuit which forms control signals epm, $\overline{\text{epm}}$ and we respectively similar to the control signals epm, $\overline{\text{epm}}$ and we described in the foregoing embodiments. The Y-selector circuit YSEL1 and the input/output circuit IOB are brought into their operating states when the control signal epm is at the high level. In contrast, the Y-selector circuit YSEL2 and the read circuit RA are brought into their operating states when the control signal $\overline{\text{epm}}$ is at the high level. Besides, the input/output circuit IOB is instructed to perform either the write operation or the read operation by the signal we.

Figure 6:
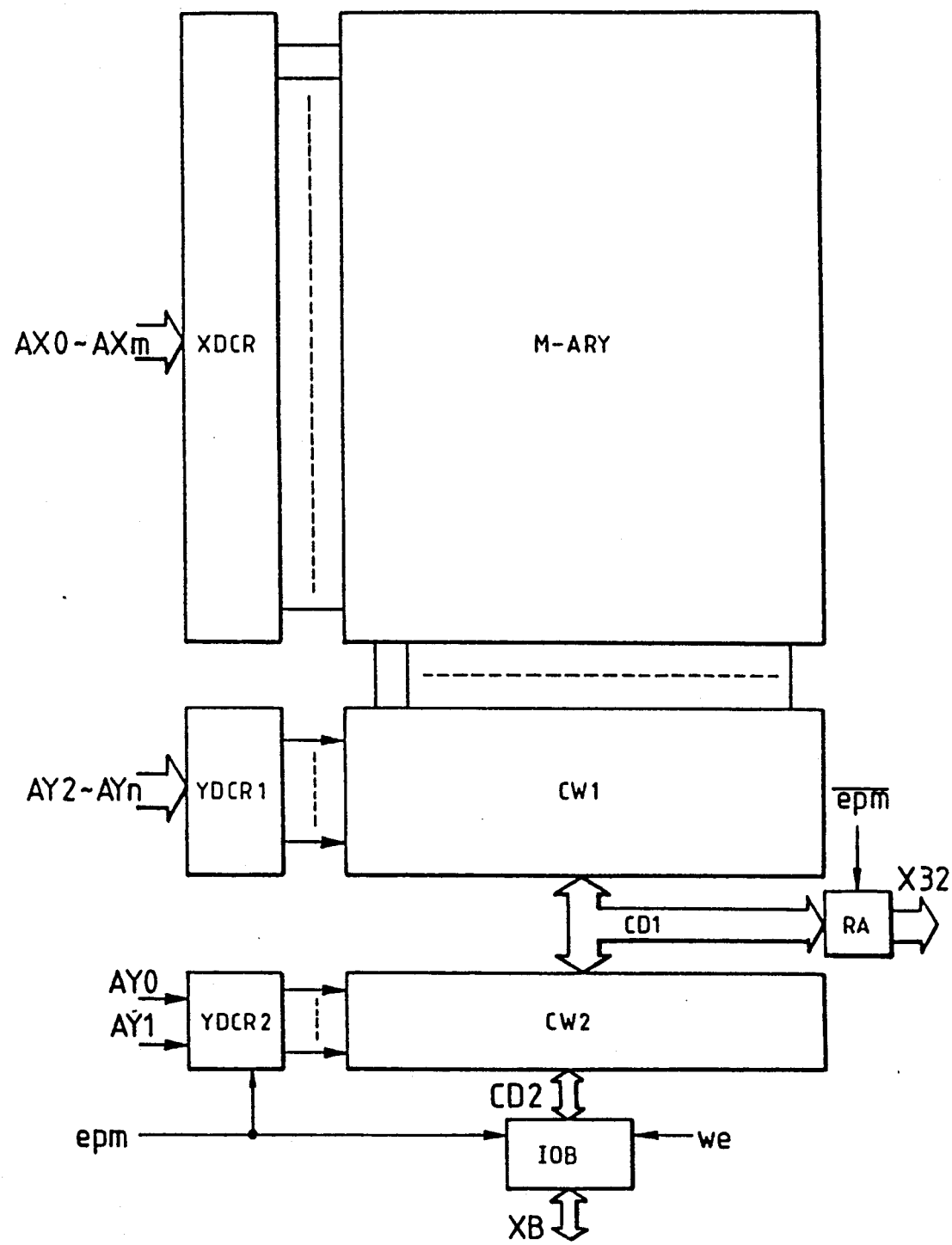
FIG. 6 is a block diagram showing still another embodiment of the EPROM circuit according to the present invention.

FIG. 6 shows a block diagram of another embodiment of the semiconductor memory device according to the present invention.

The circuit of the embodiment in FIG. 5 needs to be provided with the two Y-selector circuits YSEL1 and YSEE2, and therefore enlarges in scale to that extent. In this embodiment shown in FIG. 6, the writing and reading Y-selector circuits can be made common.

By way of example, in a case where, as in the preceding embodiment, the bit unit (the number of bits) of data items which are read for another circuit (such as CPU) formed in the identical LSI is set to be integral times (four times in the preceding example) relative to the bit unit (the number of bits) of data items which are supplied from outside the LSI in the write operations, column switching circuits are constructed in two stages. More specifically, the first column switches CW1 which are disposed in correspondence with the data lines of a memory array M-ARY operate to select the data lines in 32-bit unit (in the number of thirty-two). A first Y-decoder circuit YDCR1 is provided in correspondence with such column switches CW1. The Y-decoder circuit YDCR1 decodes address signals $AY_2$-$AY_n$ of upper bits except address signals $AY_0$ and $AY_1$ of the lowest two bits, and forms select signals to be supplied to the first column switches CW1. Laid on the output side of the first column switches CW1 are first common data lines CD1 which transmit information of 32 bits. The first common data lines CD1 are, on one hand, coupled to the input terminals of a read circuit RA, through which the information can be read in the unit of 32 bits at one time for another circuit (such as CPU) formed on the same chip as that of the EPROM. The read circuit $\overline{RA}$ has its operation controlled by the control signal $\overline{epm}$ described before, and it is brought into the operating state thereof when the EPROM is accessed from the circuit formed on the same chip as that of this EPROM.

The first common data lines CD1 are, on the other hand, coupled to the second column switches CW2 in order to perform a write operation (including a read operation for verification) in 8-bit unit. The second column switches CW2 operate to select every eight of the thirty-two common data lines CD1. More specifically, the second column switches CW2 select eight common data lines from among the first common data lines CD1 numbering thirty-two and couple the selected lines to second common data lines CD2 consisting of eight signal lines, in accordance with select signals which are formed by a second Y-decoder circuit YDCR2 receiving the address signals $AY_0$ and $AY_1$ of the lowest two bits.

The second common data lines CD2 are coupled to a writing input/output circuit IOB which transfers data in 8-bit unit.

The second decoder YDCR2 falls into the operating state thereof when the control signal epm is at the high level. On this occasion, it decodes the address signals $AY_0$ and $AY_1$. The input/output circuit IOB is also brought into the operating state thereof when the control signal is at the high level. The selection of either the write operation or the read operation is determined by the control signal we.

Thus, in the write operation, the second and first Y-decoder circuits YDCR2 and YDCR1 are brought into the operating states, and write data items of 8 bits supplied from the EPROM writer disposed outside the LSI are transmitted to the memory array M-ARY through the second column switches CW2 and first column switches CW1, whereby the write operation (including the read operation for the verify mode) in 8-bit unit can be performed.

In addition, when the read operation of the EPROM is performed by any circuit formed on the same chip as that of this EPROM, the second Y-decoder circuit YDCR2 is brought into the non-operating state thereof, and read signals of 32 bits delivered onto the first common data lines CD1 are output through the read circuit RA.

Since, in this embodiment, the first Y-decoder circuit YDCR1 and the first column switches CW1 can be used for both the write mode and the read mode as described above, the simplification of the Y-address selector circuitry becomes possible.

Figure 7:
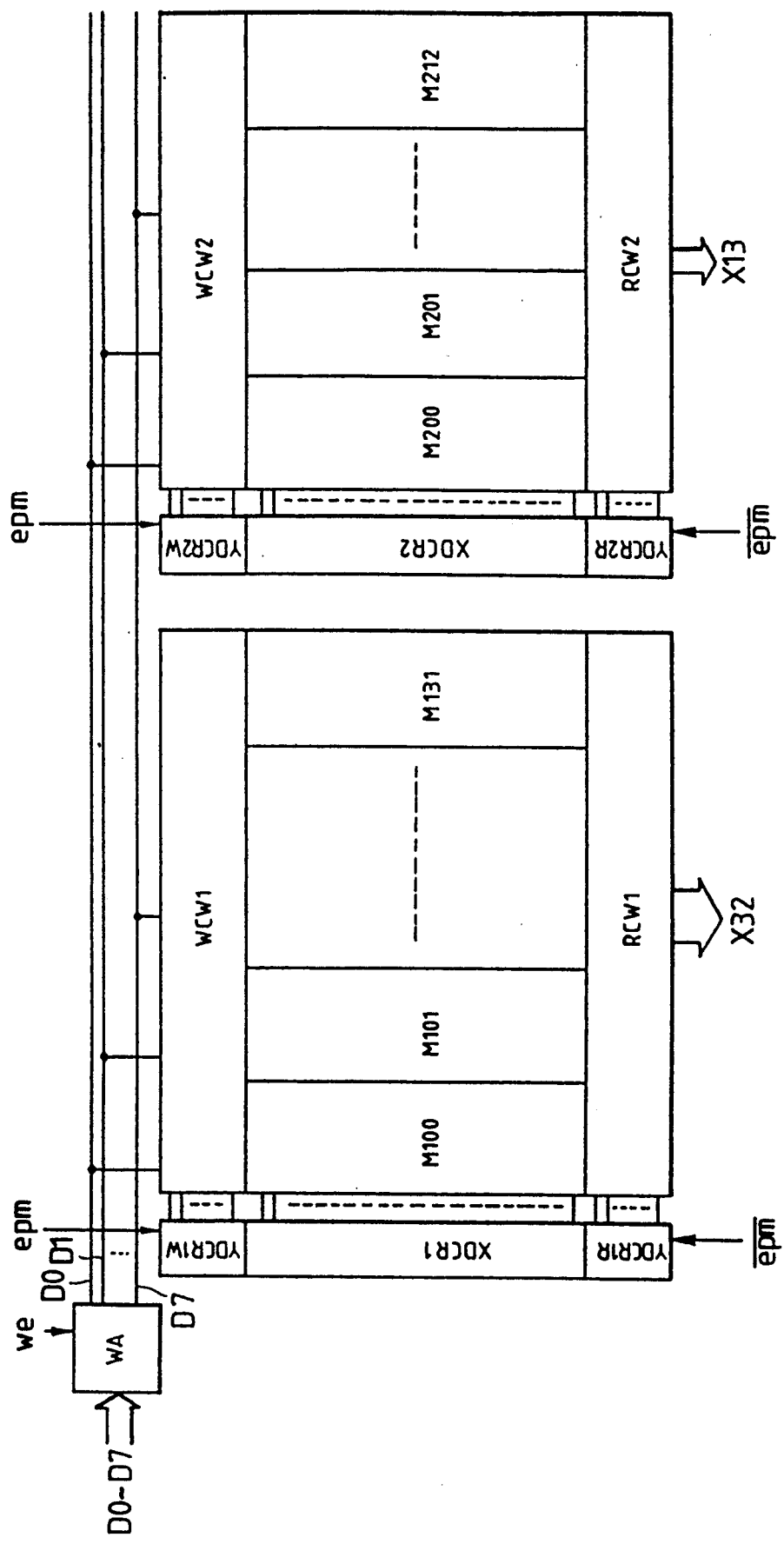
FIG. 7 is a block diagram showing yet another embodiment of the EPROM circuit according to the present invention.

FIG. 7 shows a block diagram of another embodiment of the EPROM circuit according to the present invention.

In this embodiment, a memory array M-ARY is divided into two memory blocks. One of the memory blocks is constructed of unit memory blocks M100 thru M131. Each of the unit memory blocks M100–M131 is constructed of pluralities of word lines and data lines, and nonvolatile storage elements disposed at the intersection points of the word lines and data lines. For the thirty-two unit memory blocks, the word lines are laid in common. Therefore, an X-decoder circuit XDCR1 for selecting the word lines is constructed of a single circuit. Two, column switching circuits are disposed in correspondence with the thirty-two memory blocks M100–M131. The column switches WCW1 for writing data select the data lines in such a manner that one data line is selected from each of four sets which consist of eight of the unit memory blocks M100 thru M107, M108–M115, M116–M123 and M124–M131, respectively. That is, the data lines numbering eight are selected. The selected data lines are respectively connected with eight signal lines D0 thru D7 corresponding to a write circuit WA. In order to realize such a select operation, a Y-decoder circuit YDCR1W for writing data is provided. The write circuit WA corresponds to the input/output circuit IOB described before, and transfers signals (data items) between it and a universal EPROM writer.

The thirty-two unit memory blocks M100–M131 are furnished with the column switching circuit RCW1 for reading data. This column switching circuit RCW1 selects the data lines totaling thirty-two in such a manner that one data line is selected from among the plurality of data lines in each of the unit memory blocks M100–M131, and it couples the selected data lines to thirty-two output signal lines X32, respectively. Thus, the thirty-two data lines respectively corresponding to the thirty-two unit memory blocks are selected at one time. The read circuit RA (not shown) as described before is connected to the output signal lines X32.

In this way, one memory block constructed of the thirty-two unit memory blocks M100–M131 can be subjected to the write operation (including the verify-/read mode) in 8-bit unit by the use of the X-decoder circuit XDCR1 and the writing decoder circuit YDCR1W as well as the column switching circuit WCW1 corresponding thereto. In addition, the memory block constructed of the thirty-two unit memory blocks M100–M131 can be subjected to the operation of reading data for the circuit formed on the same chip as that of the EPROM, in 32-bit unit by the use of the X-decoder circuit XDCR1 and a reading decoder circuit YDCR1R as well as the column switching circuit RCW1 corresponding thereto.

The other memory block is constructed of unit memory blocks M200 thru M212 similar to the foregoing. Although not especially restricted, the other memory block constructed of these unit memory blocks M200–M212 is furnished with an X-decoder circuit XDCR2 which serves to select word lines extended in common. Thus, the two memory blocks can be selected with their own X-address signals.

Two, column switching circuits are disposed in correspondence with the memory block constructed of the thirteen unit memory blocks M200-M212, likewise to those of the memory block constructed of the thirty-two unit memory blocks M100-M131. The column switching circuit WCW2 for writing data selects data lines in such a manner that one data line is selected from each of eight of the thirteen unit memory blocks M200-M212, for example, either the unit memory blocks M200-M207 or M208-M215 (in which the unit memory blocks M213-M215 are not actually provided and are therefore regarded as virtual unit memory blocks), and it couples the eight selected data lines to the eight signal lines DO-D7 corresponding to the write circuit WA described before, respectively. In this case, regarding the three virtual unit memory blocks M213-M215, no column switches are disposed because no signal lines to correspond thereto do not exist. Accordingly, in a write operation (including a verify/read mode) for the unit memory blocks M208-M212, data items in 8-bit unit are supplied through the signal lines DO-D7 from the write circuit WA, but those of the data items corresponding to the signal lines D5-D7 are invalidated. In order to perform the select operation in this manner, a Y-decoder circuit YDCR2W for writing data is provided.

The thirteen unit memory blocks M200 thru M212 are furnished with the column switching circuit RCW2 for reading data. This column switching circuit RCW2 selects the data lines in such a manner that one of the plurality of data lines in each of the unit memory blocks M200-M212 is selected, and it couples the selected data lines to thirteen output signal lines X13, respectively. The read circuit RA (not shown) as described before is connected to the output signal lines X13.

In this way, the other memory block constructed of the thirteen unit memory blocks M200-M212 can be subjected to the write operation (including the verify/read mode) in 8-bit unit by the use of the X-decoder circuit XDCR2 and the writing decoder circuit YDCR2W as well as the column switching circuit WCW2 corresponding thereto. In addition, the memory block constructed of the thirteen unit memory blocks M200-M212 can be subjected to the read operation in 13-bit unit by the use of the X-decoder circuit XDCR2 and a reading decoder circuit YDCR2R as well as the column switching circuit RCW2 corresponding thereto.

As thus far described, the write circuit WA is made common to the plurality of memory blocks having the unequal numbers of unit memory blocks, thereby making it possible that, while data items are written into the respective memory blocks in 8-bit unit, data items are read out of the respective memory blocks in the units of any desired numbers of bits.

In addition, the write circuit WA is controlled by the control signal we and is brought into the operating state thereof in the write operation.

Although no special restriction is intended, the Y-decoders YDCR1W and YDCR2W are controlled by the control signal epm, and the Y-decoders YDCR1R and YDCR2R are controlled by the control signal $\overline{epm}$ in this embodiment as in the foregoing embodiments. Thus, the Y-decoders YDCR1W and YDCR2W are brought into the operating states thereof in the write operation (including the verify operation), whereas the Y-decoders YDCR1R and YDCR2R are brought into the operating states thereof in the read operation.

With the construction of this embodiment, in a case where information items having significances different from each other, such as data and program words, are respectively configured of any desired unequal numbers of bits and are stored in the separate EPROM areas, the operations of writing the information items into the individual EPROM areas can be performed by a single universal writer, It is also permitted that a circuit (for example, CPU) formed on the same chip as that of the EPROM reads information of required bit configuration from the EPROM at will.

Functional effects which are attained by the embodiments stated above, are as follows: (1) A writing input circuit, and a reading output circuit which reads data in bit unit differing from that of the writing input circuit are provided, thereby to adapt the writing input circuit to a universal EPROM writer, whereby efficient writing becomes possible, and also reading in the unit of any desired number of bits becomes possible. (2) Owing to the effect (1), a universal EPROM writer of 8 bits can be used for writing data into an on-chip EMPROM from which data is read in 16- or 32-bit unit in an internal operation, so that curtailment in a writing cost can be achieved. (3) Since the number of bits of read data can be set irrespective of a write operation, the storage capacity of the memory array of an EPROM can be efficiently used, and the substantial packaging density of the EPROM can be heightened. (4) Since the number of bits of read data can be set as desired, a semiconductor integrated circuit device having an information processing function, such as a single-chip microcomputer with a built-in EPROM, can be fabricated into multifarious systems.

Although, in the above, the invention made by the inventors has been concretely described in conjunction with embodiments, it is needless to say that the present invention is not restricted to the foregoing embodiments, but that it can be variously altered within a scope not departing from the purport thereof. By way of example, in FIG. 5 or FIG. 6, the data lines of the memory array M-ARY may well be divided into a plurality of blocks so as to read data items or program words having a plurality of sorts of numbers of bits. Besides, in FIG. 7, the word lines of the two memory blocks may well be made common so as to perform a select operation by means of a single X-address decoder, In addition, the number of the memory blocks is set at a number conforming to the sorts of data, program words, etc. to be stored.

Further, the external device for accessing the EPROM built in the LSI is not restricted to the EPROM writer, but it may well be any of another microcomputer, etc.

In the above, the invention made by the inventors has been principally described as to the application thereof to a single-chip microcomputer with a built-in EPROM as forms the background field of utilization. However, the present invention is not restricted thereto, but it can also be utilized for an LSI for communications having a built-in EPROM, an LSI in which an EEPROM or RAM being electrically erasable or a readable and writable memory other than the EPROM is built, and a semiconductor memory in the form of a single product. In a case where an on-chip memory is a RAM, a kind of data conversion operation may well be executed by the RAM in such a way that signals are written into the RAM through a signal bus configured of, for example, 8 bits (bytes), and that the signals are read out of the RAM as data which is configured of a plurality of bytes and endowed with a specified significance through the combination of the signals.

What is claimed is:

1. A semiconductor integrated circuit device comprising:

external terminals;
    a plurality of word lines;
    a plurality of data lines;
    a plurality of memory cells coupled to the plurality of word and data lines so that each memory cell is coupled to one word line and to one data line;
    word line selection means for selecting one of the plurality of word lines;
    first common data lines;
    first selection means for selectively coupling selected ones of the plurality of data lines to the first common data lines, respectively;
    second common data lines, a number of which is smaller than that of the first common data lines;
    second selection means for selectively coupling selected ones of the first common data lines to the second common data lines so that the selected ones of the plurality of data lines are coupled to the second common data lines via the selected ones of first common data lines;
    read-out means coupled to the first common data lines and for selectively providing first data based on read-out data appearing on the first common data lines when the read-out means is brought into an operation state in response to a first control signal;
    input and output means coupled between the external terminals and the second common data lines for selectively inputting externally generated data received at the external terminals to the memory cells or outputting second data based on read-out data appearing on the second common data lines to the external terminals when the input and output means is brought into an operation state in response to a second control signal; and
    circuit means coupled to the read-out means and for selectively receiving the first data.

2. The semiconductor integrated circuit device according to claim 1, wherein the second selection means is brought into an operation state in response to the second control signal.

3. The semiconductor integrated circuit device according to claim 1, wherein the memory cells are non-volatile storage elements.

4. The semiconductor integrated circuit device according to claim 1, wherein the first data constitutes one microprogram, and wherein the circuit means includes a microprogram decoder receiving the first data.

5. The semiconductor integrated circuit device according to claim 1, wherein the input and output means receives a third control signal for selecting the input operation of the input and output means.

6. The semiconductor integrated circuit device according to claim 1, wherein the externally generated data is supplied at an a writer which is provided from outside of the semiconductor integrated circuit device.

7. The semiconductor integrated circuit device according to claim 1, wherein the externally generated data is in a 1-byte unit, and wherein the first data is data in a plurality of bytes unit.

8. The semiconductor integrated circuit device according to claim 1, wherein the semiconductor integrated circuit device is a microcomputer.

9. A semiconductor integrated circuit device comprising:

external terminals;
    a plurality of word lines;
    a plurality of first data lines;
    a plurality of memory cells coupled to the plurality of word lines and first data lines so that each memory cell is coupled to one word line and to one first data line;
    a word line selection circuit for selecting one of the plurality of word lines;
    common data lines;
    a first selection circuit for selectively coupling selected ones of the plurality of first data lines to the common data lines, respectively;
    second data lines, a number of which is smaller than that of the common data lines;
    a second selection circuit for selectively coupling selected ones of the common data lines to the second data lines in a first mode so that the selected ones of the plurality of first data lines are coupled to the second data lines via the selected ones of the common data lines;
    a read-out circuit coupled to the common data lines and for selectively providing first data based on read-out data appearing on the common data lines in a second mode;
    an input circuit coupled between the external terminals and the second data lines for selectively inputting second data based on externally generated data received at the external terminals to the memory cells in the first mode; and,
    circuit means coupled to the read-out means and for selectively receiving the first data.

10. The semiconductor integrated circuit device according to claim 9, wherein the memory cells are non-volatile storage elements.

11. The semiconductor integrated circuit device according to claim 9, wherein the first data constitutes one microprogram, and wherein the circuit means includes a microprogram decoder receiving the first data.

12. The semiconductor integrated circuit device according to claim 9, wherein the externally generated data is supplied from a writer which is provided at an outside of the semiconductor integrated circuit device.

13. The semiconductor integrated circuit device according to claim 9, wherein the externally generated data or the second data is data in a 1-byte unit, and wherein the first data is data in a plurality of bytes unit.

14. The semiconductor integrated circuit device according to claim 9, wherein the semiconductor integrated circuit device is a microcomputer.

15. A semiconductor integrated circuit device comprising:

external terminals;
    a plurality of word lines;
    a plurality of first data lines;
    a plurality of memory cells coupled to the plurality of word lines and first data lines so that each memory cell is coupled to one word line and to one first data line;
    a word line selection circuit for selecting one of the plurality of word lines;

common data lines;

a first selection circuit for selectively coupling selected ones of the plurality of first data lines to the common data lines, respectively;

second data lines, a number of which is smaller than that of the common data lines;

a second selection circuit for selectively coupling selected ones of the common data lines to the second data lines in a first mode so that the selected ones of the plurality of first data lines are coupled to the second data lines via the selected ones of the common data lines;

a read-out circuit coupled to the common data lines and for selectively providing first data based on read-out data appearing on the common data lines in a second mode;

an output circuit coupled between the external terminals and the second data lines for selectively outputting second data based on read-out data appearing on the second data lines to the external terminals in the first mode; and, circuit means coupled to the read-out means and for selectively receiving the first data.

16. The semiconductor integrated circuit device according to claim 15, wherein the memory cells are nonvolatile storage elements.

17. The semiconductor integrated circuit device according to claim 15, wherein the first data constitutes one microprogram, and wherein the circuit means includes a microprogram decoder receiving the first data.

18. The semiconductor integrated circuit device according to claim 15, wherein the second data is supplied to a writer which is provided at an outside of the semiconductor integrated circuit device.

19. The semiconductor integrated circuit device according to claim 15, wherein the second data is data in a 1-byte unit, and wherein the first data is data in a plurality of bytes unit.

20. The semiconductor integrated circuit device according to claim 15, wherein the semiconductor integrated circuit device is a microcomputer.

* * * * *

UNITED STATES PATENT AND TRADEMARK OFFICE
CERTIFICATE OF CORRECTION

PATENT NO. :  5,335,204
DATED      :  August 2, 1994
INVENTOR(S) : Akinori Matsuo, et al.

It is certified that error appears in the above-indentified patent and that said Letters Patent is hereby corrected as shown below:

Claim 6, column 15, line 64 (claim 6, line 3), after "supplied" delete "at an" and substitute therefor --from--; and, after "provided" delete "from" and substitute therefor --at an--.

Signed and Sealed this

First Day of November, 1994

Attest:

BRUCE LEHMAN

Attesting Officer        Commissioner of Patents and Trademarks